(12) United States Patent
Ma et al.

(10) Patent No.: US 7,119,399 B2
(45) Date of Patent: Oct. 10, 2006

(54) LDMOS TRANSISTOR

(75) Inventors: Gordon Ma, Phoenix, AZ (US);
Carsten Ahrens, München (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/788,815

(22) Filed: Feb. 27, 2004

(65) Prior Publication Data
US 2005/0189587 A1    Sep. 1, 2005

(51) Int. Cl.
*H01L 31/119* (2006.01)
(52) U.S. Cl. ...................... 257/341; 257/343
(58) Field of Classification Search ........ 257/337–351; 438/627
See application file for complete search history.

(56) References Cited

U.S. PATENT DOCUMENTS

| | | | |
|---|---|---|---|
| 4,811,075 A | 3/1989 | Eklund | 357/46 |
| 5,155,563 A | 10/1992 | Davies et al. | 357/23.4 |
| 5,252,848 A | 10/1993 | Adler et al. | 257/328 |
| 5,313,082 A | 5/1994 | Eklund | 257/262 |
| 5,654,589 A * | 8/1997 | Huang et al. | 257/763 |
| 5,693,563 A * | 12/1997 | Teong | 438/627 |
| 6,168,983 B1 | 1/2001 | Rumennik et al. | 438/188 |
| 6,563,171 B1 | 5/2003 | Disney | 257/342 |
| 6,600,182 B1 * | 7/2003 | Rumennik | 257/288 |
| 6,664,186 B1 * | 12/2003 | Callegari et al. | 438/681 |
| 6,707,102 B1 * | 3/2004 | Morikawa et al. | 257/340 |
| 2002/0179945 A1 | 12/2002 | Sakamoto et al. | 257/288 |

OTHER PUBLICATIONS

J.A. Appels and H.M.J. Vaes, "High voltage thin layer devices (RESURF devices)", IEDM technical digest, pp. 238-241, 1979.

H.M.J. Vaes and J.A. Appels, "High voltage high current lateral devices", IEDM technical digest, pp. 87-90, 1980

T. Fujihira, "Theory of Semiconductor Superjunction Devices", Jpn. J. Appl. Phys., vol. 36, pp. pp. 6254-6262, 1997.

G. Deboy, et al., "A new generation of high voltage MOSFETs breaks the limit line of silicon", IEDM technical digest, pp. 683-685, 1998.

A. Ludikhuize, "A review of RESURF technology", Proc. of ISPSD, p. 11, 2000.

J. Cai, et al., A novel high performance stacked LDD RF LDMOSFET, IEEE Electron Device Lett., vol. 22, No. 5, pp. 236-238, 2001.

J.G. Mena and C.A.T. Salama, "High voltage multiple-resistivity Drift-Region LDMOS", Solid State Electronics, vol. 29, No. 6, pp. 647-656, 1986.

M.D. Pocha and R.W. Dutton, "A computer-aided design model for High-Voltage Double Diffused MOS (DMOS) Transistors", IEEE Journal of Solid-State Circuits, vol. SC-11, No. 5, 1976.

(Continued)

*Primary Examiner*—Cuong Nguyen
(74) *Attorney, Agent, or Firm*—Baker Botts L.L.P.

(57) ABSTRACT

A semiconductor device has a semiconductor substrate, an insulating layer on top of the substrate, a lateral field effect transistor with a drain region and a source region arranged in the substrate and a gate arranged above the substrate within the insulating layer, a drain runner arranged on top of the insulator layer above the drain region, a source runner arranged on top of the insulator layer above the source region, a gate runner arranged on top of the insulator layer outside an area defined by the drain runner and the source runner, a first coupling structure with a via for coupling the drain runner with the drain region, and a second coupling structure with a via for coupling the source runner with the source region.

26 Claims, 23 Drawing Sheets

OTHER PUBLICATIONS

I. Yoshia, et al.; "Highly Efficient 1.5 GHz Si Power MOSFET for Digital Cellular Front End", Proceedings of International Symposium on Power Semiconductor Devices & ICs; Tokyo, pp. 156-157,1992.

Helmut Brech et al; "Record Efficiency and Gain at 2.1 GHz of Hih Power RF Transistors for Cellular and 3G Base Stations"; RF & DSP INfrastructure Devision, Semiconductor Products Sector, Motorola, Tempe, Arizona, 2003.

Brech H., et al., "Record Efficiency and Gain at 2.1 GHz of High Power RF Transistors for Cellular and 3G Base Stations", International Electron Devices Meeting, Technical Digest, pp. 359-362, Dec. 8, 2003.

International Search Report. PCT/EP2005/001953, 16 pages, Nov. 28, 2005.

* cited by examiner

LDMOS TRANSISTOR

FIELD OF THE INVENTION

The present application relates to an LDMOS transistor structure.

BACKGROUND OF THE INVENTION

LDMOS transistor structures are widely used as semiconductor devices for many types of transistor applications such as high voltage MOS field effect transistors. An LDMOS transistor comprises a lightly doped drain region to enhance the breakdown voltage. LDMOS transistors are, however, limited in their high frequency performance due to the feedback capacitance $C_{dg}$ between the gate and the drain. FIG. 1 shows one type of an LDMOS transistor as known in the art. A wafer comprises for example a p+ substrate 1 with an epitaxial layer 12 which includes n-type areas 2 and 3 implanted on the surface to provide a drain and source region, respectively. The backside of the substrate 1 comprises a wafer backside metal layer 9 which can be made of gold or aluminum and is used for grounding and source contact purposes. The epitaxial layer 12 is usually covered with an insulator layer 8 such as silicon oxide in which a polysilicon or silicide gate 4 is arranged to cover the channel between the drain 2 and source 3. On top of this layer is usually a passivation layer 11. Depending on the technology, the source 3 in this exemplary LDMOS transistor may be surrounded by a p-well 5. Electrodes 6 and 7 made of gold or aluminum or any other suitable metal reach through the insulating layer 8 to provide ground and drain potential for the LDMOS device.

To generally reduce a feedback capacitance, it is known to extend the source runner 6 to cover the gate 4 as shown in FIG. 1. Such a so called field plate over the gate 4 effectively decouples the gate drain capacitance $C_{gd}$ between the gate and the drain but not the gate source capacitance $C_{gs}$ between the gate and the source runners. In addition, a higher source drain capacitance is created. Furthermore, grounding of the source is needed. To this end, a p$^+$ source implant 10 is provided in a conventional LDMOS transistor. Such a so-called p$^+$ sinker 10 can be created by ion implantation. Effectively, this p+ sinker merges with the p well area 5 and, thus, reaches from the source contact 6 to the backside metal layer 9. As the backside metal layer is grounded, the p$^+$ sinker 10 provides for a connection between the source electrode 6 and ground. This type of connection generates a considerable amount of source resistance which further limits the device's high frequency performance.

SUMMARY OF THE INVENTION

According to the present application, a new transistor structure is introduced.

A semiconductor device may comprise a semiconductor substrate, an insulating layer on top of the substrate, a lateral field effect transistor comprising a drain region and a source region arranged in the substrate and a gate arranged above the substrate within the insulating layer, a drain runner arranged on top of the insulator layer above the drain region, a source runner arranged on top of the insulator layer above the source region, a gate runner arranged on top of the insulator layer outside an area defined by the drain runner and the source runner, a first coupling structure comprising a via for coupling the drain runner with the drain region, and a second coupling structure comprising a via for coupling the source runner with the source region.

The first and second coupling structure further may comprise barrier metal layers arranged at the bottom of the via. The first and second coupling structure may further comprise barrier metal layers arranged at the top of the via. The bottom barrier metal layer may have a cross-sectional profile of a saucer around the via. The bottom barrier metal layer may comprise side walls that enclose the via. The bottom barrier metal layer may comprise side walls that are spaced apart from the via. The bottom barrier metal layer may consist of Titanium-Titanium nitride. The top barrier metal layer may consist of Titanium-Platinum. The via can comprise tungsten. A sinker structure can be provided that reaches from the top to the bottom of the substrate. A backside metal layer can be provided arranged on the bottom surface of the substrate. A well structure can be provided surrounding the source region. A substrate via can be provided within the source area located under the source runner reaching from the top of the substrate to the bottom of the substrate. The substrate via can be filled with Tungsten or copper. A backside metal layer can be provided arranged on the bottom surface of the substrate and a barrier metal layer between the Tungsten or copper filled substrate via and the backside metal layer. The barrier metal layer between the source region and the via can be extended to form a field plate in such a way that it covers at least partly the gate. The field plate may cover part of the top surface of the gate and the side of the gate facing the drain runner. The field plate can be coupled with the barrier metal layer at a single location. The field plate may extend from the barrier metal layer to cover part of the left, top and right side of the gate. The first coupling structure may comprise a plurality of vias. The second coupling structure may also comprise a plurality of vias. The field plate may comprise at least one cut out area. The substrate can comprise a p+ substrate and p–epitaxial layer.

A method for manufacturing a semiconductor device may comprise the steps of:

providing a substrate comprising a lateral field effect transistor comprising a drain region and a source region arranged in the substrate, depositing an first insulating layer on top of the substrate, forming at least one window structure on top of the drain and source region, respectively, depositing a barrier metal layer within the window structures, depositing a second insulating layer on top of the substrate, forming vias within the insulating layer on top of the barrier metal layer, filling the vias with metal, planarizing the surface, depositing a runner structure over the vias on the surface.

The method may further comprise the step of depositing a second barrier metal layer on top of the via before depositing the runner. The barrier metal layer may have the cross-sectional profile of a saucer by overlapping the edges of the window. The barrier metal layer may consist of Titanium-Titanium nitride. The second barrier metal layer may consist of Titanium-Platinum. The via can be filled with tungsten. The method may also further comprise the step of forming a substrate via within the source area reaching from the top of the substrate to the bottom of the substrate before depositing the barrier metal layer. The substrate via can be filled with copper. The barrier metal layer can be extended to cover at least partly the gate formed within the insulating layer deposited on the barrier metal layer. The method may further comprise the step of implanting a sinker which reaches from the surface of the substrate located at the source barrier metal layer to the bottom of the substrate. The substrate may comprise a p+ substrate and p– epitaxial layer.

Another semiconductor device can also comprise a semiconductor substrate, an insulator layer on top of the substrate, a lateral field effect transistor comprising a drain region and a source region arranged in the substrate and a gate arranged above the substrate within the insulator layer, a drain runner arranged in the insulator layer above the drain region, a source runner arranged in the insulator layer above the source region, a gate runner arranged in the insulator layer outside an area defined by the drain runner and the source runner, a first coupling structure comprising a via for coupling the drain runner with the drain region, a second coupling structure comprising a via for coupling the source runner with the source region, wherein the first and second coupling structure further comprise barrier metal layers arranged at the top and the bottom of the via, a sinker structure that reaches from the top to the bottom of the substrate, and a backside metal layer arranged on the bottom surface of the substrate.

The barrier metal layer between the source region and the via can be extended to form a field plate in such a way that it covers at least partly the gate. The substrate may comprise a p+ substrate and p– epitaxial layer.

Another semiconductor device may comprise a semiconductor substrate, an insulator layer on top of the substrate, a lateral field effect transistor comprising a drain region and a source region arranged in the substrate and a gate arranged above the substrate within the insulator layer, a drain runner arranged in the insulator layer above the drain region, a source runner arranged in the insulator layer above the source region, a gate runner arranged in the insulator layer outside an area defined by the drain runner and the source runner, a first coupling structure comprising a via for coupling the drain runner with the drain region, a second coupling structure comprising a via for coupling the source runner with the source region, wherein the first and second coupling structure further comprise barrier metal layers arranged at the top and the bottom of the via, a substrate via filled with metal within the source area located under the source runner reaching from the top of the substrate to the bottom of the substrate, and a backside metal layer arranged on the bottom surface of the substrate and a barrier metal layer between the filled substrate via and the backside metal layer.

The barrier metal layer between the source region and the via can be extended to form a field plate in such a way that it covers at least partly the gate. The substrate may comprise a p+ substrate and p– epitaxial layer.

Another semiconductor device may comprise a semiconductor substrate, an insulator layer on top of the substrate, a backside metal layer, a lateral field effect transistor comprising a drain region and a source region arranged in the substrate and a gate arranged above the substrate within the insulator layer, a drain runner arranged in the insulator layer above the drain region, a source runner arranged in the insulator layer above the source region, a gate runner arranged in the insulator layer outside an area defined by the drain runner and the source runner, a first coupling structure comprising a via for coupling the drain runner with the drain region, a second coupling structure comprising a via for coupling the source runner with the backside metal layer.

The first and second coupling structure may further comprise barrier metal layers arranged at the bottom of the via. The first and second coupling structure may further comprise barrier metal layers arranged at the top of the via. The bottom barrier metal layer may consist of Titanium-Titaniumnitride. The via of the second coupling structure may comprise an insulating side wall layer. The via of the second coupling structure can be filled with tungsten. The via further may include a Tantalum-Tantalum nitride-copper seed layer covering the tungsten layer. The via can be filled with copper. A well structure surrounding the source region and/or a field plate that covers at least partly the gate may be provided. The field plate may cover part of the top surface of the gate and the side of the gate facing the drain runner. The first coupling structure may comprise a plurality of vias. The second coupling structure may also comprise a plurality of vias. The second coupling structure may further comprise a source via for coupling the source runner with the source region. The source via comprises barrier metal layers can be arranged at the top and the bottom of the source via. The bottom barrier metal layer may have a cross-sectional profile of a saucer around the via. The top and bottom barrier metal layer may consist of Titanium-Titaniumnitride. The source via can comprise tungsten. The second coupling structure may comprise a plurality of vias and source vias which are arranged in an alternative pattern. The substrate may also comprise a p+ substrate and p– epitaxial layer.

Another method for manufacturing a semiconductor device may comprise the steps of:
  providing a substrate comprising a lateral field effect transistor comprising a drain region and a source region arranged in the substrate and a gate structure arranged in an insulating layer deposited on top of the substrate,
  performing a planarization process on top of the substrate,
  forming a hard mask on top of the substrate including at least one window structure on top of the drain and source region, respectively,
  etching at least one via through the window within the substrate,
  filling the vias with metal,
  forming a metal runner structure on top of the via,
  grinding the bottom surface of the substrate to expose the metal within the via.

The step of filling the via with metal may comprise the steps of:
  depositing an insulation layer in the via,
  depositing a metal within the via.

The step of depositing an insulation layer may include the steps of:
  depositing undoped silicon glass in the via,
  sputtering and annealing the via with Titanium-Titanium nitride.

The step of depositing a metal may include the steps of:
  depositing tungsten in the via,
  sputtering via with a Tantalum-Tantalum nitride/Copper layer,
  filling the via with copper.

The method may further comprise the step of depositing a barrier metal layer on top of the via before forming the metal runner. After the step of filling the via with metal the top surface of the substrate can be planarized by chemical mechanical polishing. The method may further comprise the steps of depositing a barrier metal layer on the exposed metal of the via. The method may also comprising the step of depositing a metal layer on the backside of the substrate. The substrate may comprise a p+ substrate and p– epitaxial layer.

Other technical advantages of the present disclosure will be readily apparent to one skilled in the art from the following figures, descriptions, and claims. Various embodiments of the present application obtain only a subset of the advantages set forth. No one advantage is critical to the embodiments.

BRIEF DESCRIPTION OF THE DRAWINGS

A more complete understanding of the present disclosure and advantages thereof may be acquired by referring to the following description taken in conjunction with the accompanying drawings, in which like reference numbers indicate like features, and wherein.

DETAILED DESCRIPTION OF THE PREFERRED EMBODIMENTS

Figure 1:
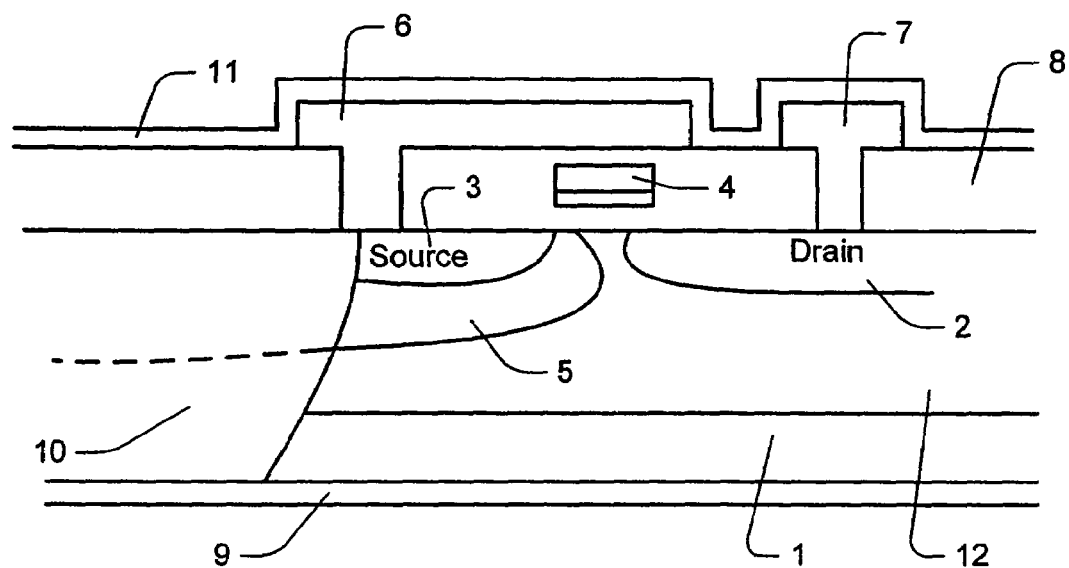
FIG. 1 is a partial sectional view of a semiconductor wafer including a transistor structure according to the prior art.
Figure 2:
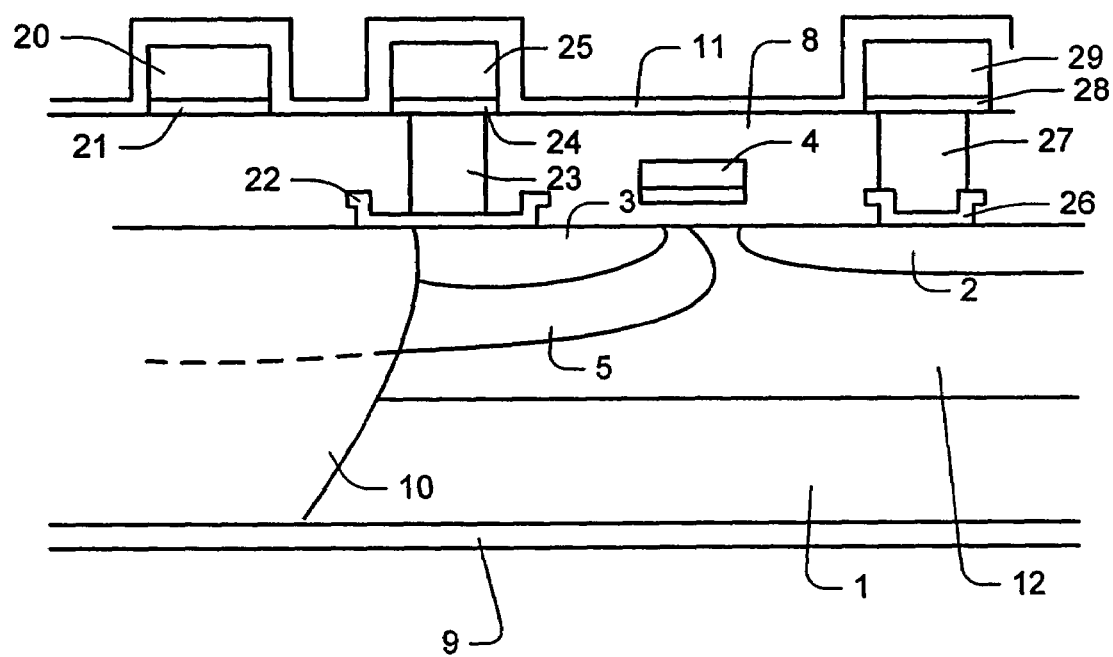
FIG. 2 is a partial sectional view of a semiconductor wafer including a transistor structure according to a first embodiment of the present invention.

Turning to the drawings, exemplary embodiments of the present application will now be described. FIG. 2 depicts an exemplary n-p-n lateral field effect transistor, such as a lightly doped drain MOS transistor (LDMOS). Similar areas carry similar numerals with respect to a transistor according to the prior art as shown in FIG. 1. A different concept of forming and arranging the respective runners for drain, gate and source is used in this type of improved transistor structure. FIG. 2 shows again a p+ type substrate with a p– epitaxial layer 12 and a backside metal layer 9 consisting, for example, of gold. N-type Drain and source regions 2, 3 are provided within the p– epitaxial layer 12. The source region 3 is surrounded by a stronger doped p-well 5. Through ion implantation, a $p^+$ sinker area 10 is created which reaches from the source contact down to the backside of the substrate. A drain runner 29 and a source runner 25 are deposited on the top of the oxide layer 8 above the respective drain and source regions 2, 3. Outside the area defined be the drain and source runner, a gate runner 20 is located on the left side of the source runner 25, on top of the oxide layer 8. The gate runner 20 can be coupled with the gate at a single area (not shown in FIG. 2) depending on the structure of the transistor. Thus, the source runner 25 effectively shields the gate runner from the drain runner 29. The drain, source, and gate runners 29, 25, 20 can be made of appropriate metal such as gold or aluminum. The source runner 25 is coupled with the source region 3 through a via 23. This via 23 can be filled with tungsten or any other suitable metal. Between the gold source runner 25 and the tungsten via 23 on top of the oxide layer 8, a thin Titanium-Platinum layer working as a barrier metal layer can be deposited and etched according to the shape of runner 25. This barrier layer improves the coupling between the runner and the via which consist of different metals and thus its material depends on the material used for the runner and via, respectively. A special barrier layer 22 having a cross-sectional profile of a saucer is located on top of the source region 3 and the sinker 10 between the tungsten via 23 and the source region 3/sinker 10. This layer 22 can be made out of Titanium-Titaniumnitride. Again, this barrier layer 22 improves the coupling between the source region 3/sinker 10 and the via and thus its material depends on the material used for the source region and via, respectively.

A similar structure is used for the drain consisting of drain runner 29, Titanium-Platinum layer 28, tungsten via 27 and Titanium-Titaniumnitride layer 26. Layers 22 and 26 may have the cross-sectional profile of a saucer as shown in FIG. 2. Different embodiments for these coupling barrier layers 22 and 26 are shown in FIG. 2. Layer 26 closely surrounds tungsten via 27 whereas layer 22 provides for a gap between the side walls of the tungsten via 23. However, both types can be used for the drain and the source couplings. The barrier metal layers 21, 24 and 28 are deposited and etched in the same manufacturing step. Thus, a barrier metal layer 21 is also provided in this step for the runner 20.

Figure 3A:
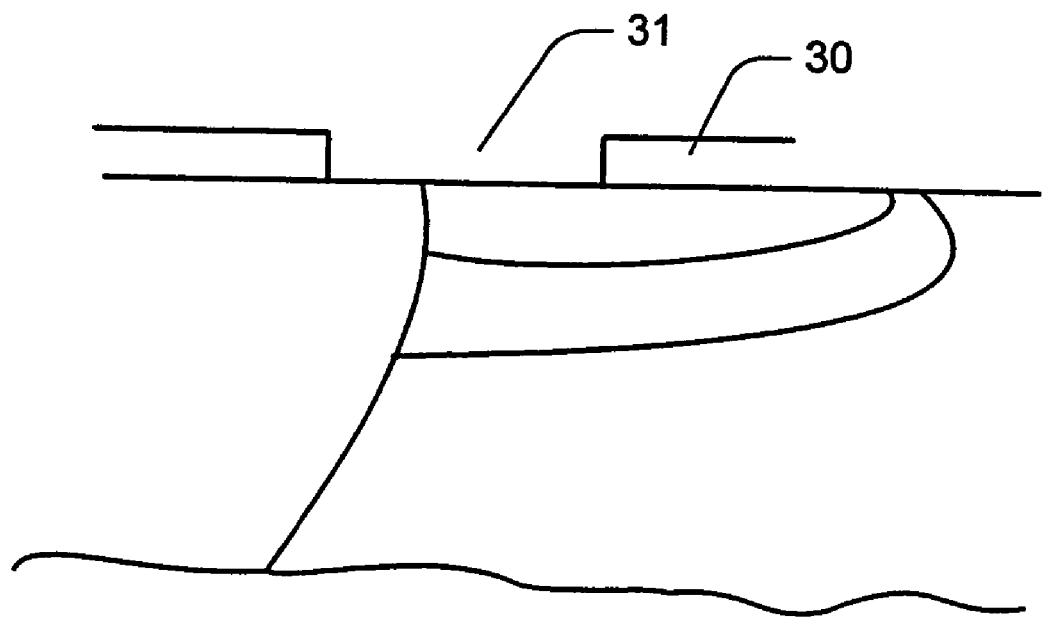
FIGS. 3A–3D show different exemplary manufacturing steps for manufacture of a transistor according to the present invention.
Figure 3B:
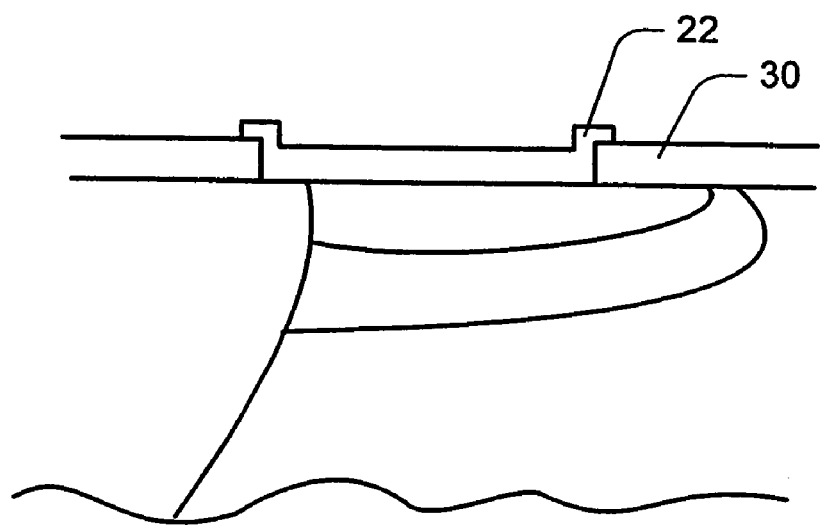
Figure 3C:
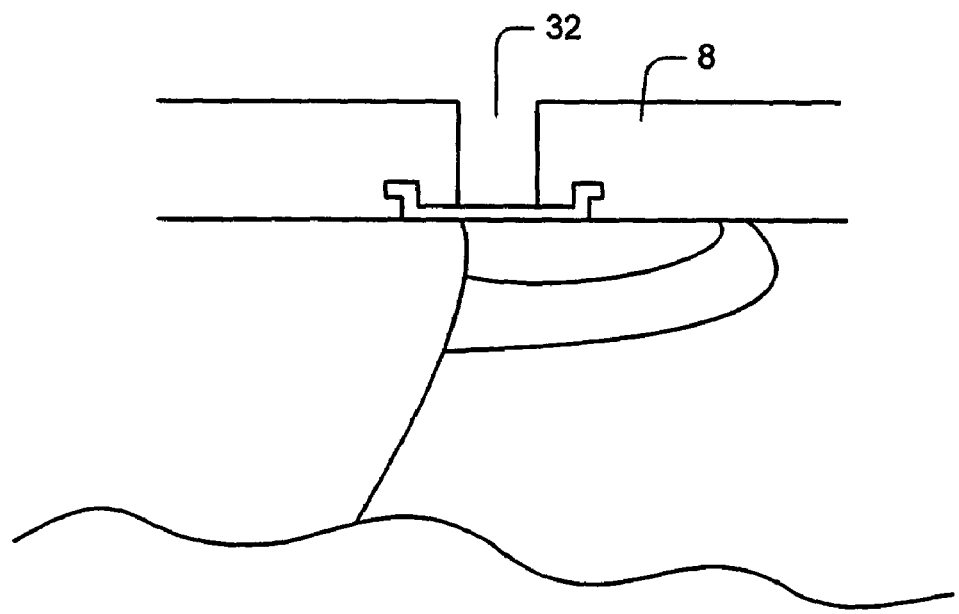
Figure 3D:
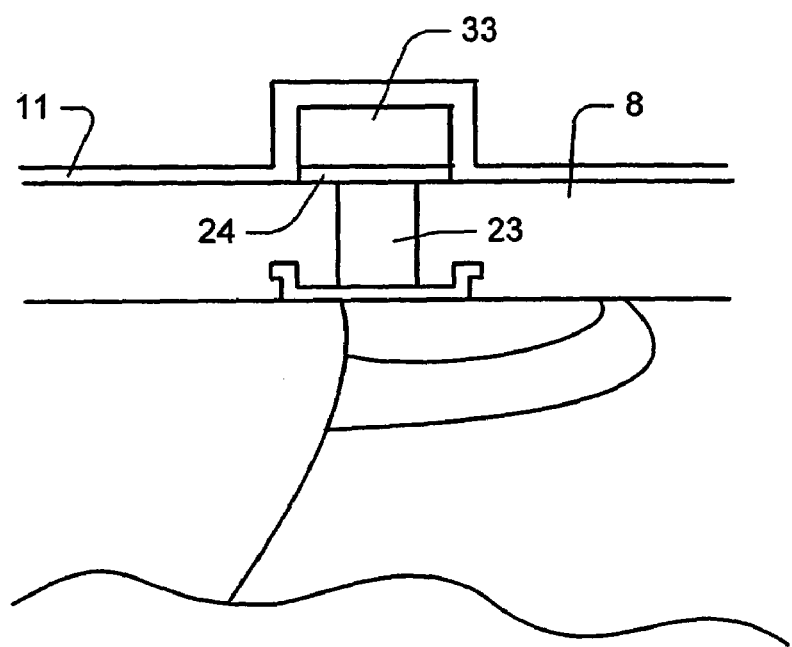

FIG. 3A–3D show exemplary steps for a manufacturing process for such a transistor structure. First, as shown in FIG. 3A, a relatively thin layer of oxide is applied to the substrate after drain and source regions 2 and 3 have been created. Using the appropriate photo etching technology, windows 31 are created in which thin layers of Titanium-Titaniumnitride 22 are deposited to form barrier metal layer 22 and 26 as shown in FIG. 3B. These layers 22 and 26 may have the cross-sectional profile of a saucer as explained above and shown in FIG. 2. Next, another oxide layer 8 is deposited and gate structure 4, for example, a two layer gate consisting of polysilicon and titanium silicide, can be formed within this oxide layer as known in the art (not shown in FIG. 3). The coupling of the barrier metal layers 22, 26 with the respective source and drain runners is created as follows. Again, as shown in FIG. 3C, photo etching technology is used to create a respective via 32. This via 32 is then filled with tungsten 23, 27, respectively as shown in FIG. 3D. On top of the tungsten via 23, 27 a Titanium-Platinum layer forming the barrier metals 21, 24, and 28 can be deposited and etched. This additional layer provides a coupling between the tungsten via 23, 27 and the following gold or aluminum runners 25, 29. Finally, a passivation layer 11 is deposited to cover the metal runners and the oxide layer. These steps can be easily integrated into known manufacturing processes.

Figure 4:
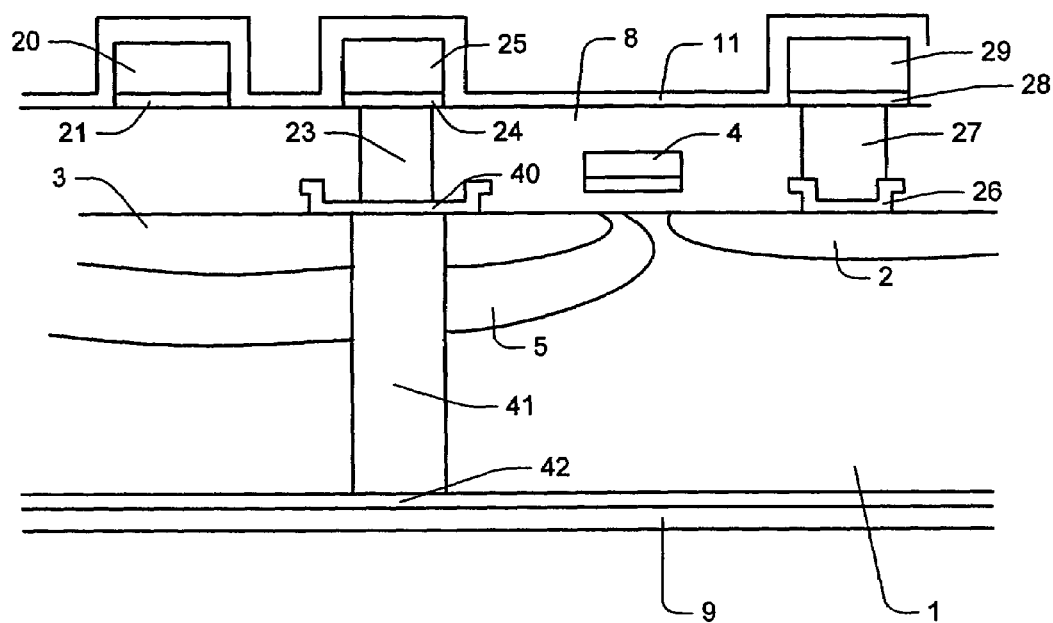
FIG. 4 is a partial sectional view of a semiconductor wafer including a transistor structure according to another embodiment of the present invention.

FIG. 4 shows another embodiment which does not require a p+ sinker to provide grounding for the source electrode. Again, similar structures carry similar numerals. In this embodiment, only a p− substrate 1 is used. Optionally, a p+ substrate and p− epitaxial layer structure as shown in FIGS. 1 and 2 can be provided in the usual manner. In this embodiment, the source metal barrier 40 has again a different form than the drain metal barrier 26, thus, metal barrier 26 completely surrounds the via 27 whereas metal barrier 40 provides for a gap with respect to via 23. Instead of the p+ sinker as shown in the previous figures, only a direct connection between the source electrode and the backside metal layer 9 is provided. To this end, a substrate via 41 is created which essentially forms a hole through substrate 1, thus, coupling the backside wafer 9 with the barrier metal layer 40. The backside of the substrate 1 is covered with a first thin barrier layer 42 consisting for example of Titanium-Platinum and a gold metal layer 9. The major part of the via is filled with tungsten or copper to provide a direct and permanent grounding of the source electrode. The thin layer 42 is used to provide a coupling between a backside layer 9 made of gold and the tungsten or copper filled substrate via 41. In case different metals are used for filling the substrate via or for the backside layer, different materials for the coupling layer 42 might apply.

Figure 5:
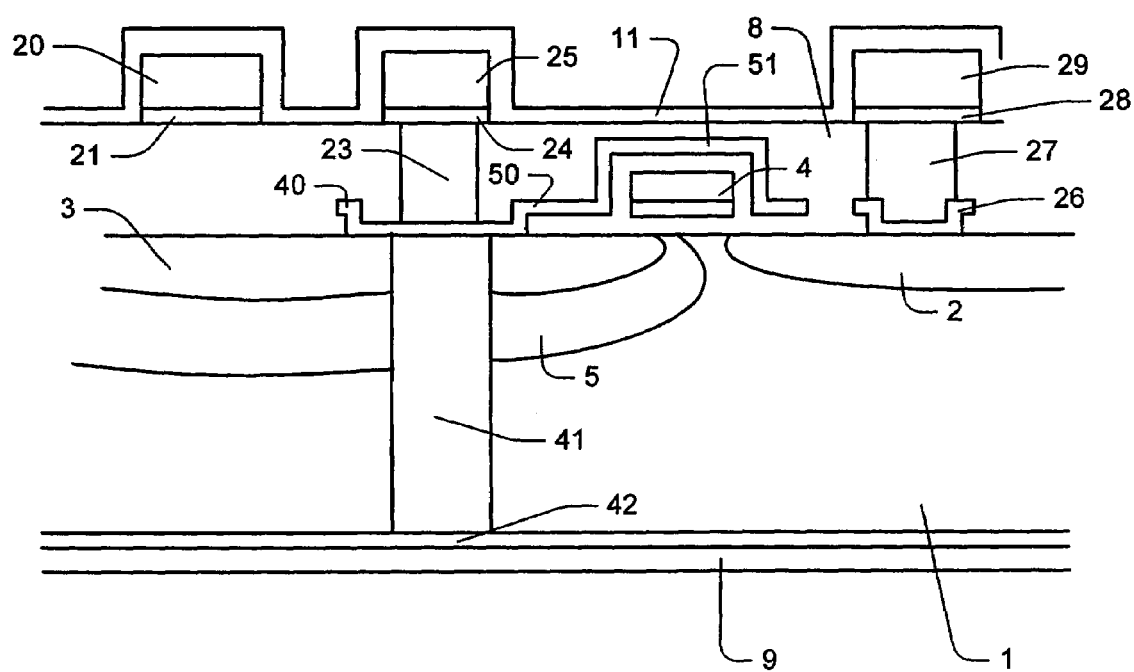
FIG. 5 is a partial sectional view of a semiconductor wafer including a transistor structure according to yet another embodiment of the present invention.

FIG. 5 shows yet another embodiment similar to the one shown in FIG. 4. However, this enhancement can also be applied to the embodiment shown in FIG. 2. In this further embodiment, the saucer-profiled barrier layer 40 is extended on the right side horizontally through an extension 50. A field plate 51 extends from this extension 50 which covers the gate 4. Thus, this field plate 51 covers most of the gate 4 to decrease any gate drain capacitance. The extension 50 extends horizontally toward the gate 4. This extension can be preferably on the same level as layer 40. The field plate 51 then covers the left side, the top of the gate 4 and reaches down to the right side of the gate 4. The field plate may then extend further in direction of the barrier metal 26 as shown in FIG. 5. However, the field plate may reach less far. For example, the field plate 51 can only extend on the right side downwards to the same level as on the left side to completely cover the gate 4. As shown in FIG. 4, the barrier metal 40 is coupled with the backside metal layer 9 through a substrate via 41 which reaches from the top surface of the substrate 1 through the source region 3, 5 down to the metal layer 9. Again, between metal layer 9 and the substrate via 41, a barrier metal layer 42 is provided.

Figure 7A:
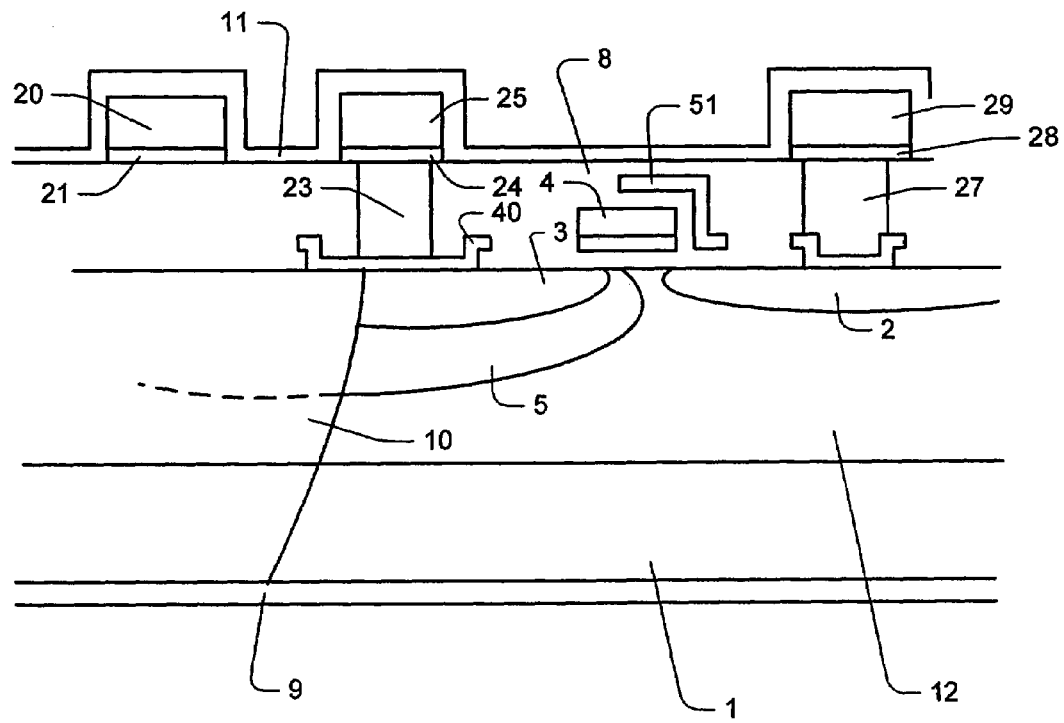
FIGS. 7A and 7B are a partial sectional view of a semiconductor wafer including a transistor structure according to yet another embodiment of the present invention.
Figure 7B:
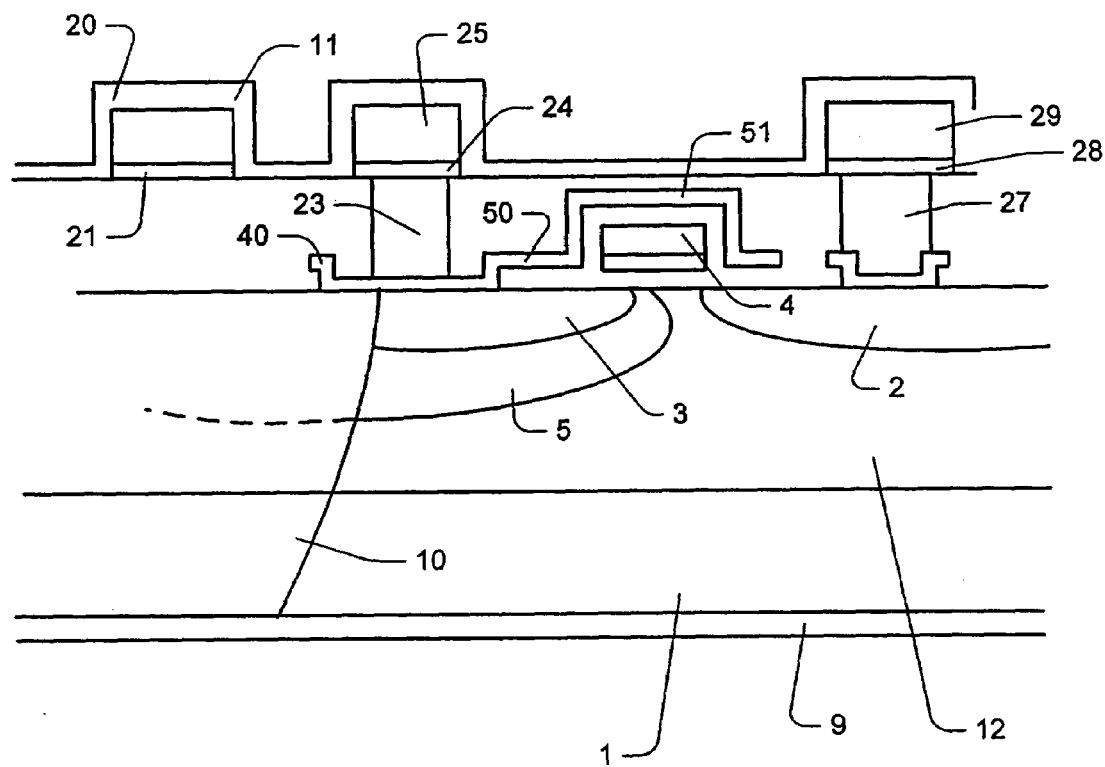
Figure 8:
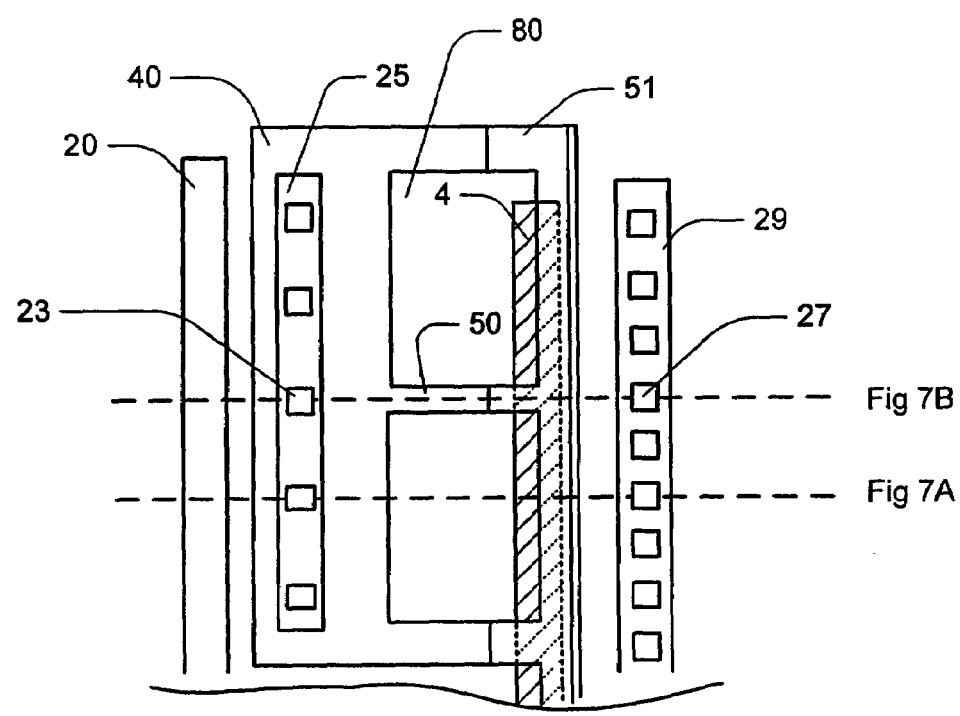
FIG. 8 is a partial top view of an LDMOS transistor as shown in FIGS. 7A and 7B.

FIG. 8 shows a top view of some of the structures of the transistor. The view is a cut through the runners 20, 25, AND 29. However, for a better overview some elements may be omitted and others are shown in addition (such as the vias and the gate, etc.). The gate runner 20 comprises the form of a stripe extending along the side of the field plate 40/51. The gate runner is coupled at one or more locations with the gate 4. However, this connection is not shown in FIG. 8. The source runner 25 extends within the area of the field plate 40 also in form of a stripe. Exemplary, different vias 23 are indicated. As can be seen in this embodiment, vias 23 have preferably a square footprint. Depending on the design and the technology, the vias 23 could, however, be combined to a single trench-like via. The source runner 25 does not have any other connections as it is coupled through either a sinker or a via as for example shown in FIG. 7A or 7B, respectively. The field plate 51 may comprise a plurality of cut outs 80. FIG. 8 shows two cut outs 80, however, more cut outs can be provided. Furthermore, the field plate can also be provided in one single piece with no cut outs 80. On the right side, the drain runner 26 has again a stripe form and extends parallel to the source runner. Again a plurality of vias 27 are indicated in FIG. 8. Again, these vias have a square footprint. Depending on the technology and design, a rectangular footprint is also possible or the plurality of vias could be merged into a single elongated trench-like via.

Figure 6:
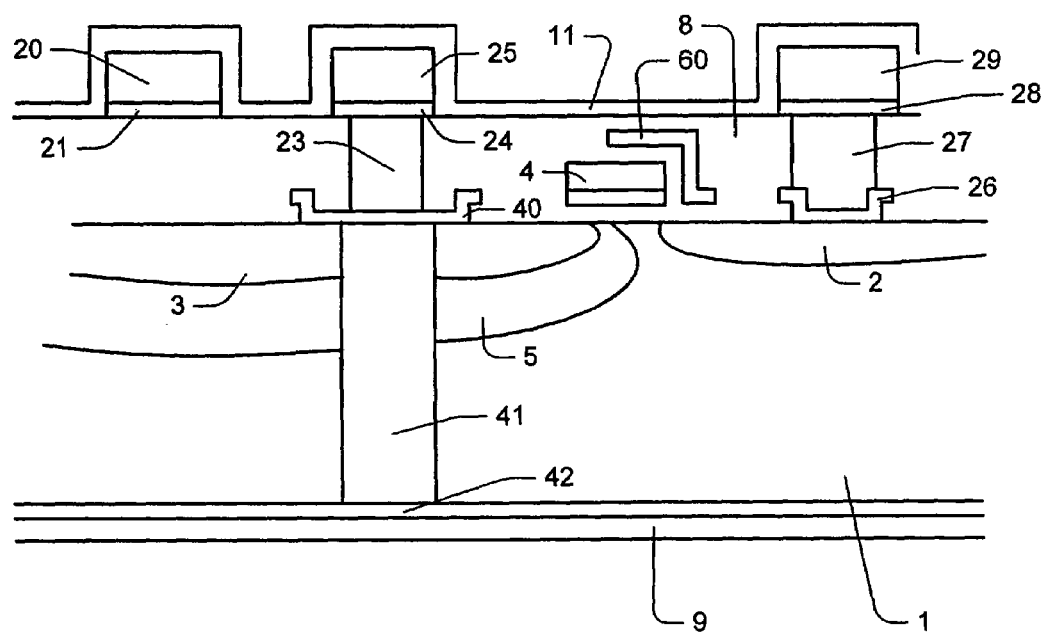
FIG. 6 is a partial sectional view of a semiconductor wafer including a transistor structure according to yet another embodiment of the present invention.

FIG. 6 shows yet another embodiment similar to the one shown in FIG. 5. However, this enhancement can also be applied to the embodiment shown in FIG. 2. In this further embodiment, the field plate 60 only covers part of the top of gate 4 and the side of gate 4 facing the drain runner 29. A coupling between this field plate 60 and the metal barrier 40 can be provided at a different place (not shown in this sectional view). Thus, this field plate 60 covers only those parts of the gate 4 to decrease any gate drain capacitance. The field plate 51 thus covers most of the top of the gate 4 and reaches down to the right side of the gate 4. The field plate 60 may then extend further in direction of the barrier metal 26 as shown in FIG. 6. However, the field plate may reach less far. For example, the field plate 60 can only extend on the right side downwards to the same level as barrier metal layer 26.

Figure 9:
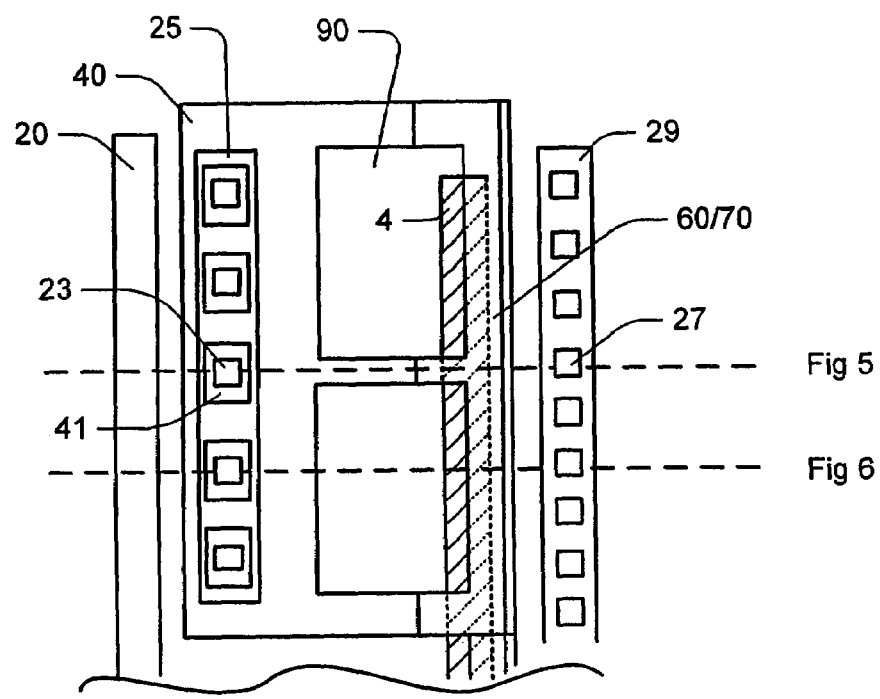
FIG. 9 is a partial top view of an LDMOS transistor as shown in FIGS. 5 and 6.

FIG. 7A shows the same structure with respect to the field plate shown in FIG. 6 in combination with the embodiment shown in FIG. 2. Similarly, FIG. 7B shows the same structure with respect to the field plate shown in FIG. 5 in combination with the embodiment in FIG. 2. In both FIGS. 7A and 7B, the field plate is again designated with numeral 51 and the bridge connecting the field plate 51 with the metal barrier 40 is designated with numeral 50. Instead of the substrate via, this embodiment as shown in FIGS. 7A and 7B uses a p⁺-sinker 10 which reaches from the surface of the substrate next to the source region 3, 5 down to the backside metal layer 9. FIG. 9 shows a top view of some of the structures of the transistor as shown in FIGS. 5 and 6. The view is again a cut through the runners 20, 25, and 29. As indicated with respect to FIG. 8, for a better overview some elements may be omitted and others additionally shown. The gate runner 20 comprises the form of a stripe extending in parallel along the side of the field plate 40; 60/70. The gate runner is coupled at one or more locations with the gate 4. Again, this connection is not shown in FIG. 9. The source runner 25 extends within the area of the field plate 40 also in form of a stripe. Exemplary, different vias 23 and underlying vias 41 are indicated. As can be seen in this embodiment, vias 23 have preferably a square footprint and the underlying substrate via 41 an elongated rectangular footprint. Depending on the design and the technology, the underlying substrate vias 41 could be combined into a trench-like single via. Similarly, if possible and desirable, the vias 23 could be combined to a single trench-like via. The source runner 25 does not have any other connections in this exemplary embodiment as it is coupled through the vias as shown in FIGS. 5 and 6, respectively. The field plate here comprises also two cut outs 90. However, more or less cut outs can be provided. On the right side, the drain runner 29 has again a stripe form and extends parallel to the source runner. Again, a plurality of vias 27 are indicated in FIG. 9. Depending on the technology and design, a rectangular footprint is also possible or the plurality of vias 27 could be merged into a single elongated trench-like via.

Figure 10:
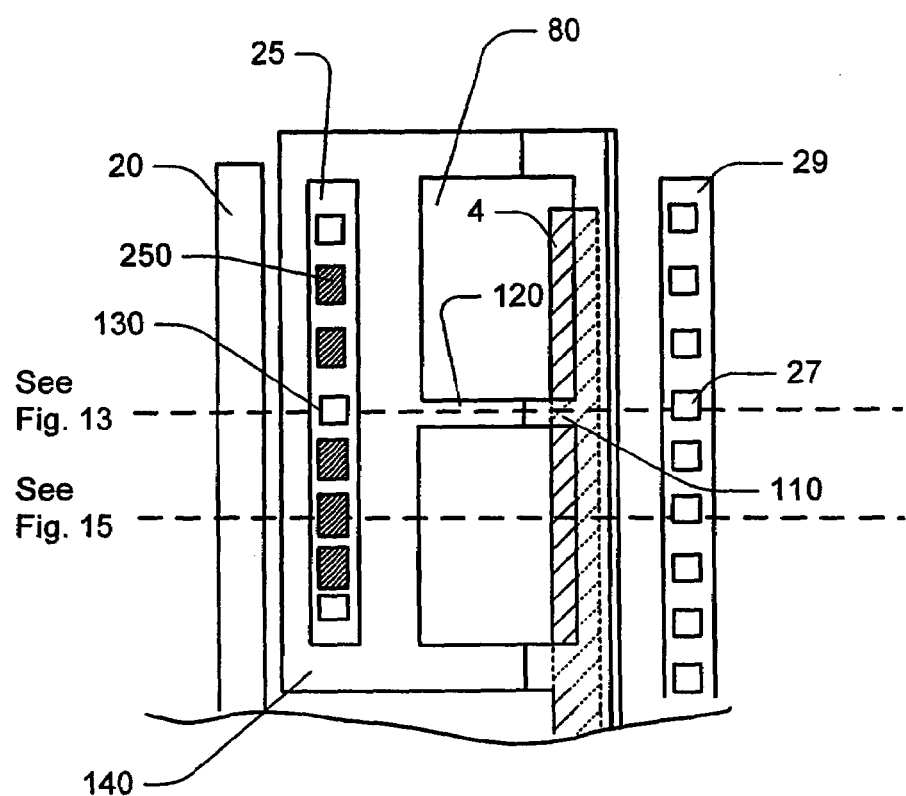
FIG. 10 is a partial sectional view of a semiconductor wafer including a transistor structure according to yet another embodiment of the present invention along a line shown in FIGS. 13 and 15.
Figure 13:
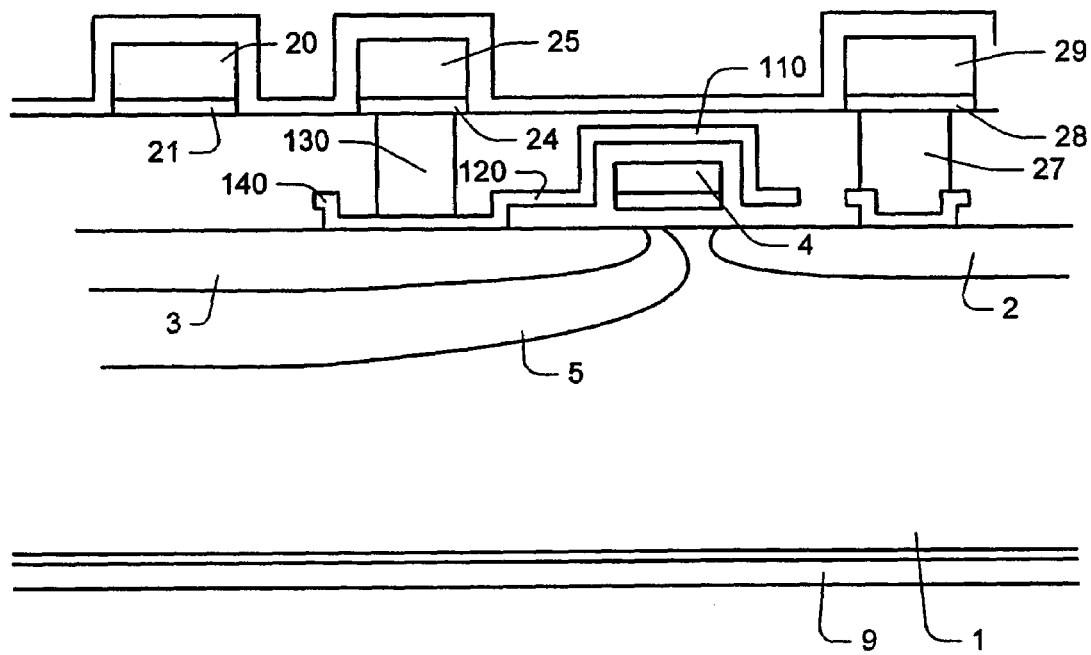
FIG. 13 is a partial top view of another embodiment of the field plate as shown in FIGS. 10 and 11.
Figure 15:
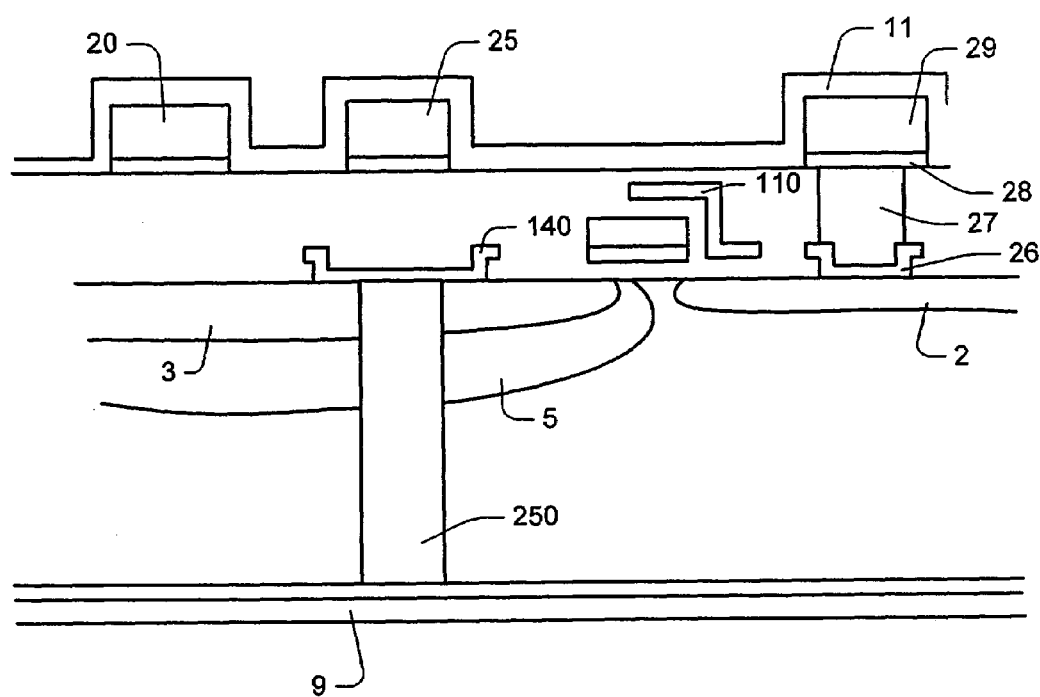
FIG. 15 is a partial sectional view of a semiconductor wafer including a transistor structure according to yet another embodiment of the present invention along a line shown in FIG. 10.

FIG. 10 shows a top view of another embodiment according to the present invention similar to the embodiments shown in FIG. 8. However, in this embodiment different types of via structures are used for coupling the source runner 25 with the backside metal layer 9 and the source region 3, 5. The "open blocks" indicate a via structure 130 as shown in FIG. 13 which only couples the runner 25 with the source region 3, 5. These vias 130 have, preferably, a square footprint. The "filled blocks" indicate a via structure 250 as shown in FIG. 15 which couples the source region 3, 5 with the backside metal layer 9. These vias 250 have, preferably, a rectangular footprint. Thus, as shown in FIG. 10, a series of alternative via structures 250 and 130 are used. In this particular embodiment three vias of the type 130 and five vias of the type 250 are used. However, the particular placement of the different type vias is a design choice. Nevertheless, an alternative pattern similar to the one shown in FIG. 10 is preferred. Depending on the technology and the design, adjacent vias of the same kind could be combined to a single trench-like via. The dashed lines in FIG. 10 indicates a sectional view shown in FIG. 13 and in FIG. 15 including vias 130 and 250.

FIG. 15 shows the sectional view as indicated by the bottom dashed line in FIG. 10. In this section, the field plate 110 only covers part of the top of gate 4 and the side of gate 4 facing the drain runner 29. A coupling between this field plate 60 and the metal barrier 40 can be provided at a different place (not shown in this sectional view, see FIG. 13). Thus, this field plate 60 covers only those parts of the gate 4 to decrease any gate drain capacitance. The field plate 110 thus covers most of the top of the gate 4 and reaches down to the right side of the gate 4. The field plate 110 may then extend further in direction of the barrier metal 26. However, the field plate may reach less far. For example, the field plate 110 can only extend on the right side downwards to the same level as barrier metal layer 26. As can be seen in FIG. 15, no via is provided between the runner 25 and the barrier metal layer 140. In this particular section of the transistor, only via 250 provides for a connection between the source region 3, 5 and the backside layer 9 through barrier metal layer 42.

Figure 11:
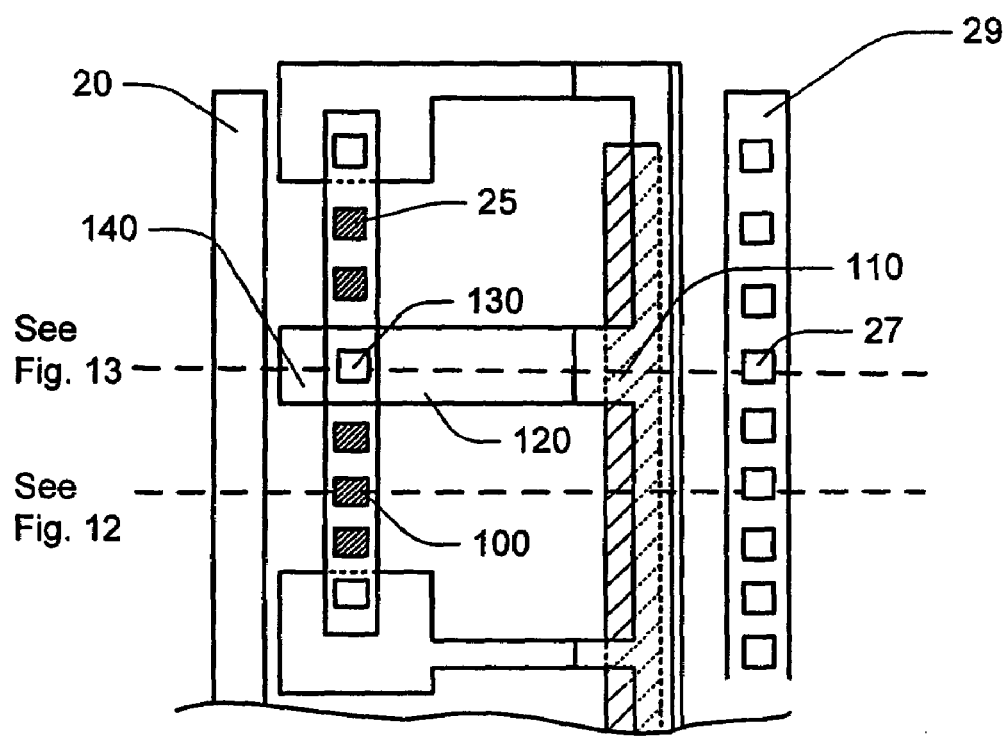
FIG. 11 is a partial sectional view of a semiconductor wafer including a transistor structure according to yet another embodiment of the present invention, along lines shown in FIGS. 12 and 13.
Figure 12:
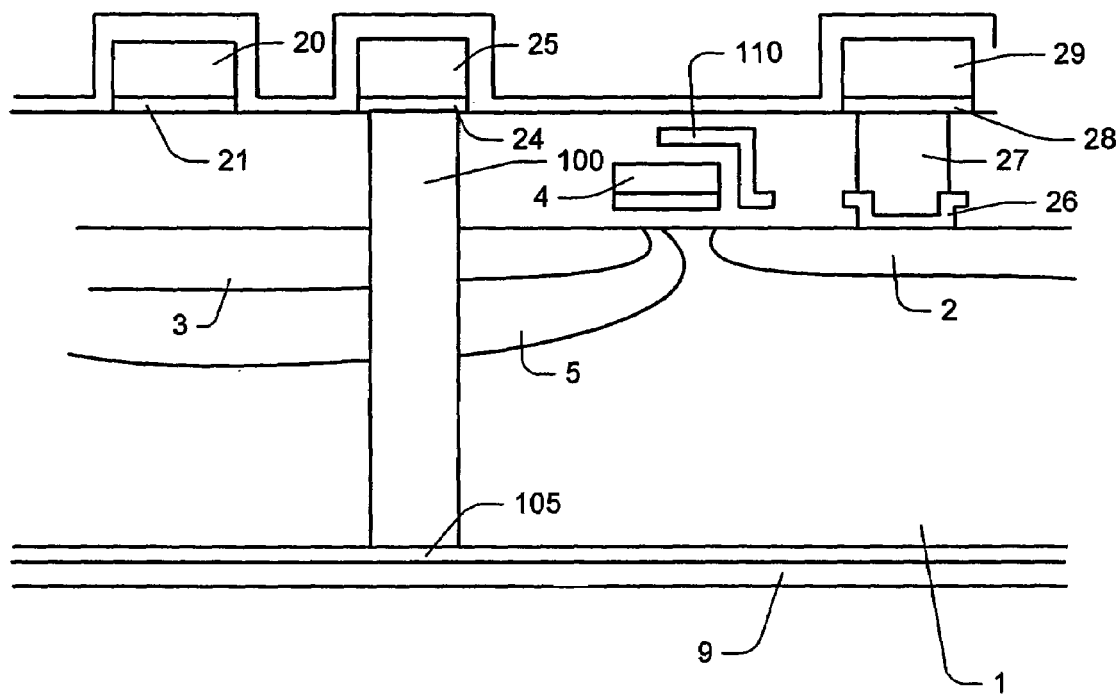
FIG. 12 is a partial top view of another embodiment of the field plate as shown in FIGS. 10 and 11.

FIG. 11 shows a top view of yet another embodiment according to the present invention similar to the embodiments shown in FIG. 10. Again, different types of via structures are used for coupling the source runner with the backside metal layer 9 and the source region 3, 5. The "open blocks" indicate a via structure 130 as shown in FIG. 13 which only couples the runner 25 with the source region 3, 5. These vias 130 have, preferably, a square footprint. The "filled blocks" indicate a via structure 100 as shown in FIGS. 12 and 14 which couples the runner 25 with the backside metal layer 9. These vias 100 have, preferably, a rectangular footprint. Again, depending on the technology and the design, adjacent vias of the same kind could be combined to a single trench-like via. The structure of the field plate is such that the field plate proper 110 is only connected to barrier metal 140 at the location where the via 130 is used to couple the runner 25 with the source region 3. Again bridge sections 120 are used to connect the barrier metal 140 with the field plate proper 110.

FIG. 11 shows cut outs at the bridge sections of the upper and lower connections. However, other design choice are possible, for example, strips more or less wide as the barrier metal around the via 130 can connect the field plate 110 with the barrier metal 140. FIGS. 8 to 11 show a stripe form for all runners and a rectangle form for the field plate structure 40, 50, 51/60/70;140, 120, 110 and the cut outs 80, 90.

However, the form of these elements is not critical and other suitable forms depending on the design and the technology may be used. For example, the cut outs 80 may be extended to the top and/or bottom in FIG. 8 so that only a single bridge 50 connects the field plate elements 40 and 51. Alternatively, more than three couplings between elements 40 and 51 of the field plate may be provided. Similarly, only a single connection between the elements 40 and 60/70 as shown in FIG. 9 can be provided. The particular design of the field plate depends on the several parameters such as resistance, capacity and other influencing factors.

In FIG. 12 similar elements carry again similar numerals. As explained above, the difference to the embodiment shown in FIG. 6 is that a single via structure 100 couples the source runner 24, 25 with the backside metal layer 9. Again a metal barrier layer 105 is deposited between the via structure 100 and the backside metal layer 9.

In FIG. 13 a similar structure to the structure shown in FIG. 2 is formed. The difference to the embodiment of FIG. 2 is that no sinker structure is present because the via structure shown in FIG. 12 is used at other locations as indicated in FIGS. 10 and 11.

Figure 14A:
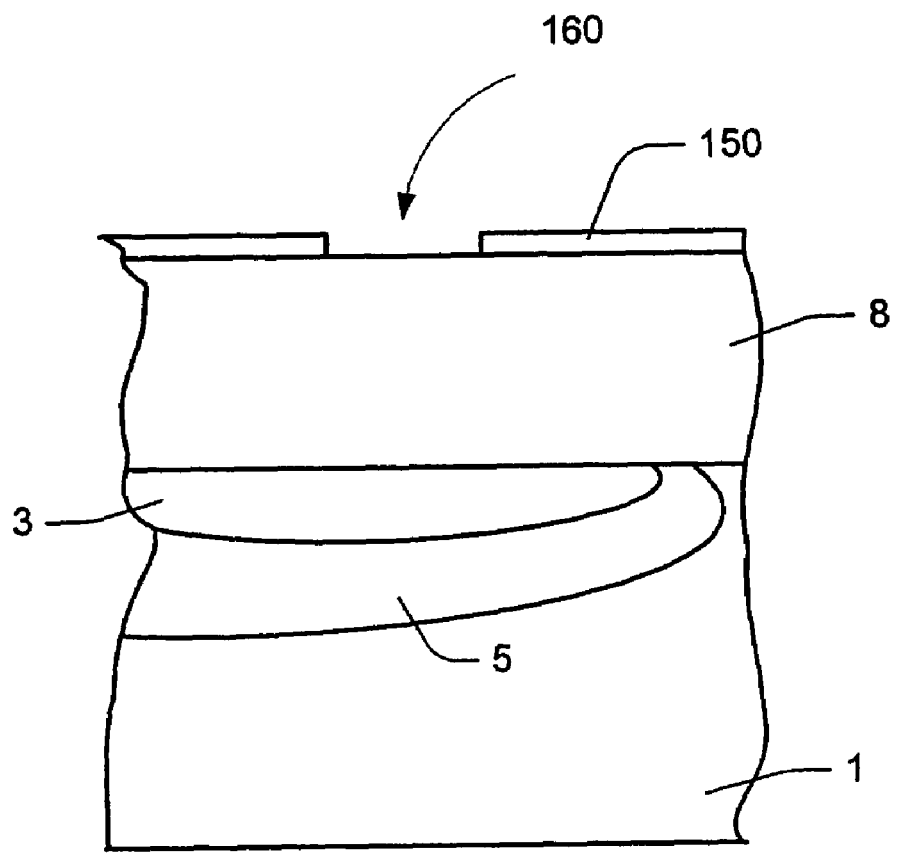
FIGS. 14A–E show different exemplary manufacturing steps for manufacture of a via structure as shown in FIG. 10.
Figure 14B:
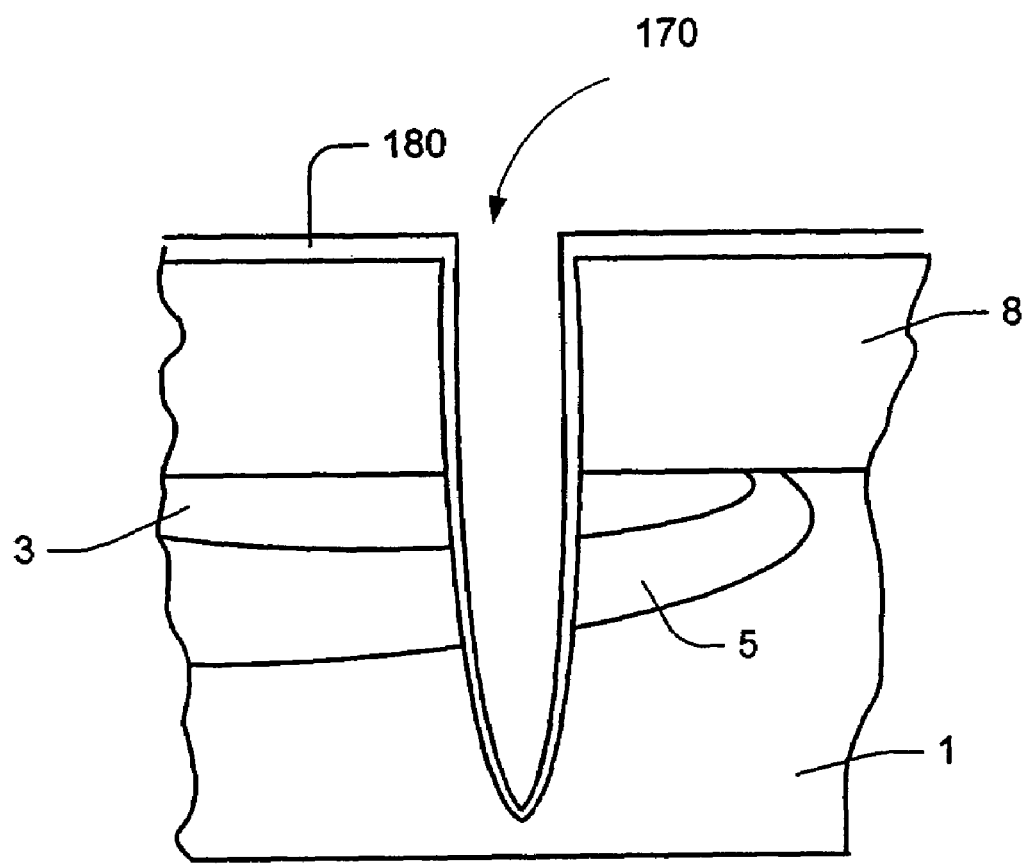
Figure 14C:
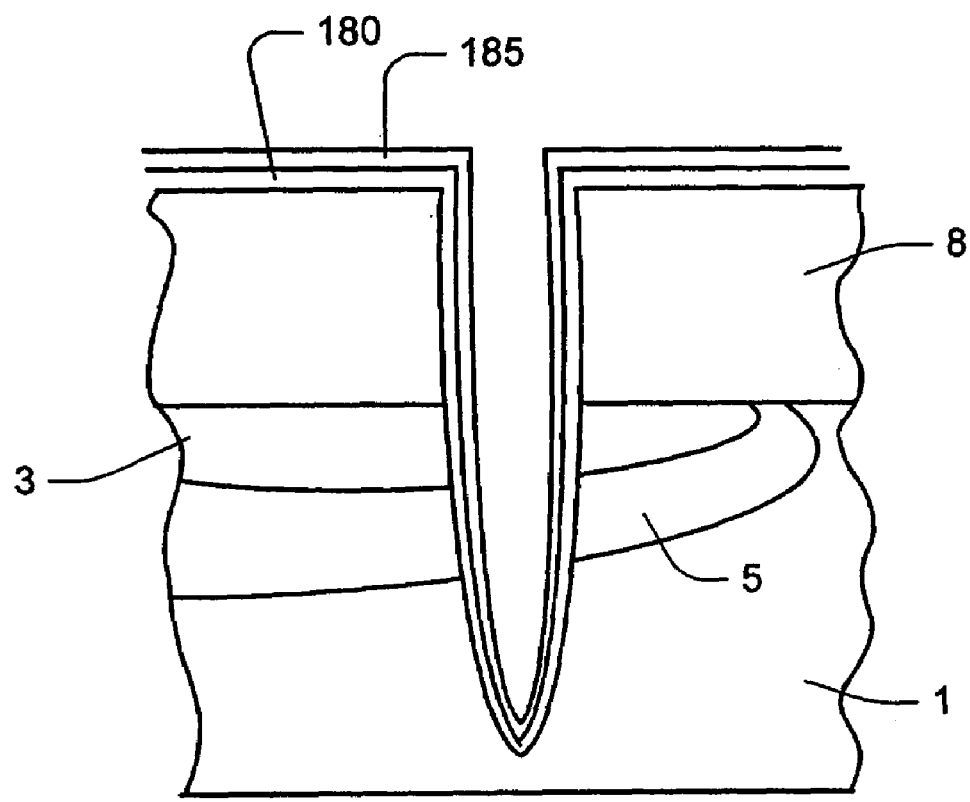
Figure 14D:
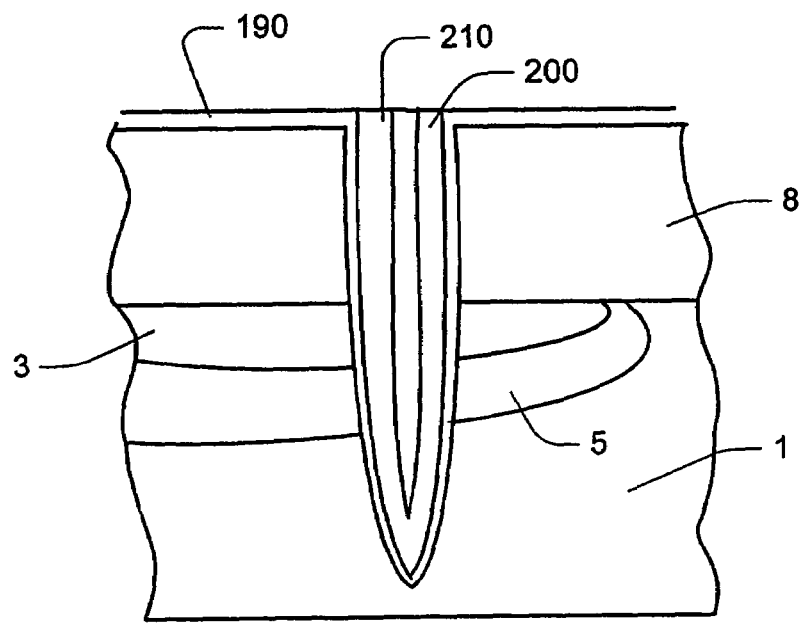
Figure 14E:
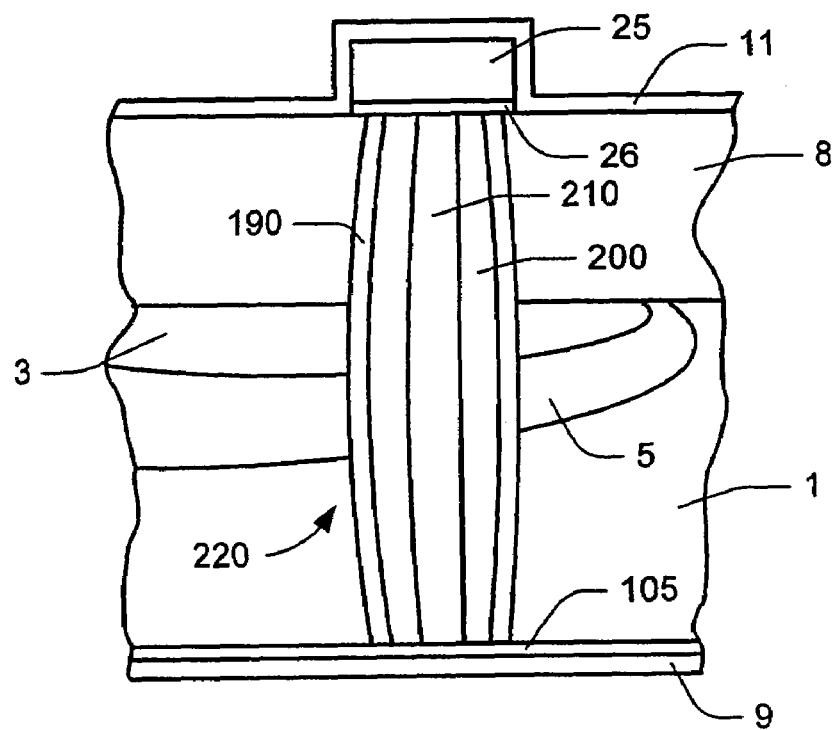

FIG. 14A–E shows different steps in the manufacturing process to create a single via for coupling a runner with the backside metal layer. FIG. 14A shows the relevant portion of a wafer after the dielectric planarization process. At this time a hard mask 150, for example, silicon nitride is used to form mask including at least one window 160 through which a via can be etched. FIG. 14B shows the via 170 after the etching which extends deep into the substrate 1. Optionally, dielectric isolation layers 180 of undoped silicon glass and silicon nitride can be subsequently deposited, in particular within the via to cover the via side walls, as shown in FIG. 14B. However, if contact to a specific area, for example, the source region 3, 5 is necessary, no insulation layers will be deposited in the via. Thus, depending on where the via is placed and depending on its function an insulation layer can be used to isolate the via from the surrounding area or no insulation layer is used to couple the surrounding area with the via. FIG. 14C shows another layer 185 on top of layer 180 or directly after etching of the via which can be obtained through Titanium/Titanium nitride sputter and anneal processes. FIGS. 14D and 14E show the layers previously deposited as a single layer 190 for a better overview or the single Titanium/Titanium nitride layer (now designated with numeral 190). In a next step, Tungsten 200 is deposited into the substrate via followed by a Tantalum/Tantalum nitride/Copper seed layer. A copper deposition 210 then follows to fill the substrate via. The surface is then planarized by a chemical mechanical polishing process. A barrier layer 26 is deposited patterned and followed by a top layer metal deposition 25, for example, using gold or aluminum to stack the metal to the substrate via 220 as shown in FIG. 14E. Finally, a passivation layer 11 is deposited to cover the structure. FIG. 14E also shows the structure after backside grinding, backside damage etch, backside copper CMP, deposition of the barrier metal layer 105, for example of titanium platinum, and deposition of backside metal layer 9 (gold or gold tin) to complete the front to back via structure.

What is claimed is:

1. A Semiconductor device comprising:
   a semiconductor substrate,
   an insulating layer on top of said substrate,
   a lateral field effect transistor comprising a drain region and a source region arranged in said substrate and a gate arranged above said substrate within said insulating layer, a drain runner arranged on top of the insulator layer above said drain region, a source runner arranged on top of the insulator layer above said source region, a gate runner arranged on top of the insulator layer outside an area defined by said drain runner and said source runner, a first coupling structure comprising a via for coupling said drain runner with said drain region, and a second coupling structure comprising a via for coupling said source runner with said source region and a barrier metal layer arranged at the bottom of said via and within said insulating layer, wherein the barrier metal layer comprises a first horizontal bottom layer adjacent said via and a side wall being rectangular to and surrounding said first horizontal bottom layer and said side wall is spaced apart from said via.

2. The Semiconductor device as claimed in claim 1, wherein said first coupling structure further comprises barrier metal layers arranged at the bottom of said via.

3. The Semiconductor device as claimed in claim 1, wherein said first and second coupling structure further comprise barrier metal layers arranged at the top of said via.

4. The Semiconductor device as claimed in claim 2, wherein said bottom barrier metal layer has a cross-sectional profile of a saucer around said via.

5. The Semiconductor device as claimed in claim 4, wherein the bottom barrier metal layer comprises side walls that enclose said via.

6. The Semiconductor device as claimed in claim 2, wherein the bottom barrier metal layer consists of Titanium-Titanium nitride.

7. The Semiconductor device as claimed in claim 3, wherein the top barrier metal layer consists of Titanium-Platinum.

8. The Semiconductor device as claimed in claim 1, wherein the via comprises tungsten.

9. The Semiconductor device as claimed in claim 1, further comprising a sinker structure that reaches from the top to the bottom of said substrate.

10. The Semiconductor device as claimed in claim 9, further comprising a backside metal layer arranged on the bottom surface of said substrate.

11. The Semiconductor device as claimed in claim 1, further comprising a well structure surrounding said source region.

12. The Semiconductor device as claimed in claim 1, further comprising a substrate via within said source area located under said source runner reaching from the top of said substrate to the bottom of said substrate.

13. The Semiconductor device as claimed in claim 12, wherein said substrate via is filled with Tungsten or copper.

14. The Semiconductor device as claimed in claim 13, further comprising a backside metal layer arranged on the bottom surface of said substrate and a barrier metal layer between said Tungsten or copper filled substrate via and said backside metal layer.

15. The Semiconductor device as claimed in claim 13, further comprising a well structure surrounding said source region.

16. The Semiconductor device as claimed in claim 2, wherein said barrier metal layer between the source region and the via is extended to form a field plate in such a way that it covers at least partly said gate.

17. The Semiconductor device as claimed in claim 16, wherein the field plate covers part of the top surface of the gate and the side of the gate facing the drain runner.

18. The Semiconductor device as claimed in claim 17, wherein the field plate is coupled with the barrier metal layer at a single location.

19. The Semiconductor device as claimed in claim 16, wherein the field plate extends from the barrier metal layer to cover part of the left, top and right side of the gate.

20. The Semiconductor device as claimed in claim 1, wherein the first coupling structure comprises a plurality of vias.

21. The Semiconductor device as claimed in claim 1, wherein the second coupling structure comprises a plurality of vias.

22. The Semiconductor device as claimed in claim 16, wherein the field plate comprises at least one cut out area.

23. The Semiconductor device as claimed in claim 1, wherein the substrate comprises a p+ substrate and p- epitaxial layer.

24. A Semiconductor device comprising:

a semiconductor substrate, an insulator layer on top of said substrate, a lateral field effect transistor comprising a drain region and a source region arranged in said substrate and a gate arranged above said substrate within said insulator layer, a drain runner arranged in said insulator layer above said drain region, a source runner arranged in said insulator layer above said source region, a gate runner arranged in said insulator layer outside an area defined by said drain runner and said source runner, a first coupling structure comprising a via for coupling said drain runner with said drain region, a second coupling structure comprising a via for coupling said source runner with said source region and a barrier metal layers arranged at the bottom of said via and within said insulating layer, wherein the barrier metal layer comprises a first horizontal bottom layer adjacent said via and a side wall being rectangular to and surrounding said first horizontal bottom layer and said side wall is spaced apart from said via, wherein said first and second coupling structure further comprise barrier metal layers arranged at the top and the bottom of said via, a sinker structure that reaches from the top to the bottom of said substrate, and a backside metal layer arranged on the bottom surface of said substrate.

25. The Semiconductor device as claimed in claim 24, wherein said barrier metal layer between the source region and the via is extended to form a field plate in such a way that it covers at least partly said gate.

26. The Semiconductor device as claimed in claim 24, wherein the substrate comprises a p+ substrate and p- epitaxial layer.

* * * * *